US008359186B2

(12) United States Patent
Ganesan et al.

(10) Patent No.: US 8,359,186 B2
(45) Date of Patent: Jan. 22, 2013

(54) METHOD FOR DELAY IMMUNE AND ACCELERATED EVALUATION OF DIGITAL CIRCUITS BY COMPILING ASYNCHRONOUS COMPLETION HANDSHAKING MEANS

(76) Inventors: Subbu Ganesan, Saratoga, CA (US); Ramesh Narayanaswamy, Palo Alto, CA (US); Ian Michael Nixon, Sunnyvale, CA (US); Leonid Alexander Broukhis, Fremont, CA (US); Thomas Hanni Spencer, Sunnyvale, CA (US)

( * ) Notice: Subject to any disclaimer, the term of this patent is extended or adjusted under 35 U.S.C. 154(b) by 703 days.

(21) Appl. No.: 11/766,017

(22) Filed: Jun. 20, 2007

(65) Prior Publication Data
US 2007/0294075 A1 Dec. 20, 2007

Related U.S. Application Data

(63) Continuation-in-part of application No. 11/307,198, filed on Jan. 26, 2006, now Pat. No. 7,548,842.

(51) Int. Cl.
G06F 17/50 (2006.01)
(52) U.S. Cl. .................. 703/14; 703/13; 703/23; 71/30; 717/134; 370/258
(58) Field of Classification Search ............ 703/23, 703/14, 22, 28, 13; 716/1, 5, 7, 3, 18; 714/30, 714/33; 365/189.05; 712/208
See application file for complete search history.

(56) References Cited

U.S. PATENT DOCUMENTS

| | | | | |
|---|---|---|---|---|
| 5,754,826 A * | 5/1998 | Gamal et al. | | 703/14 |
| 5,809,271 A * | 9/1998 | Colwell et al. | | 712/208 |
| 6,058,492 A * | 5/2000 | Sample et al. | | 714/33 |
| 6,523,155 B1 * | 2/2003 | Ruedinger | | 716/7 |
| 6,961,691 B1 * | 11/2005 | Selvidge et al. | | 703/28 |
| 7,548,842 B2 * | 6/2009 | Ganesan et al. | | 703/14 |
| 2004/0111248 A1 * | 6/2004 | Granny et al. | | 703/22 |
| 2004/0123258 A1 * | 6/2004 | Butts | | 716/5 |
| 2005/0198606 A1 * | 9/2005 | Gupta et al. | | 716/18 |
| 2006/0059387 A1 * | 3/2006 | Swoboda et al. | | 714/30 |
| 2006/0117274 A1 * | 6/2006 | Tseng et al. | | 716/1 |
| 2007/0282589 A1 * | 12/2007 | Bershteyn et al. | | 703/23 |
| 2008/0080261 A1 * | 4/2008 | Shaeffer et al. | | 365/189.05 |
| 2008/0168407 A1 * | 7/2008 | Manohar | | 716/3 |

OTHER PUBLICATIONS

Zhuang et al., "An asynchronous wrapper with novel handshake circuits for GAL systems", IEEE, 2002.*
Wuu et al., "A design of a fast and area efficient Multi-input Muller C element", IEEE, 1993.*
Deng et al., "Asynchronous circuits and systems in Superconducting RSFQ digiatl technology", IEEE, 1998.*
Deng et al., "Self-timing and vector processing in RSFQ digital circuit technology", IEEE, 1999.*

* cited by examiner

Primary Examiner — Kandasamy Thangavelu
(74) Attorney, Agent, or Firm — Patentry

(57) ABSTRACT

An RTL hardware description language simulation accelerator and circuit emulator which operates on data driven asynchronous completion handshaking principles. Deploying Muller C elements to control latches, the system does not depend on externally provided clocks or internal timing circuits with delay logic or clock generators. Each levelized domain of logic signals a successor level to begin execution of instructions with a level complete message produced when all its input operands have produced a completion message. Each predecessor stage holds back data production until the successor stage is ready. Each levelized data-driven asynchronous domain evaluation processor is self-timed receiving completion messages from its predecessors, and sending completion messages to its successors.

8 Claims, 3 Drawing Sheets

METHOD FOR DELAY IMMUNE AND ACCELERATED EVALUATION OF DIGITAL CIRCUITS BY COMPILING ASYNCHRONOUS COMPLETION HANDSHAKING MEANS

CO-PENDING RELATED APPLICATIONS

The present invention is a continuation in part of non-provisional utility application Ser. No. 11/307,198 Asymmetrical evaluation and canvassing processors, first named inventor Ganesan, file date Jan. 26, 2006 now U.S. Pat. No. 7,548,842.

REFERENCES

Sutherland, Ivan, "Micropipelines", Communications of the ACM, June 1989, Volume 32 Num 6. pp. 720-738

Brunvand, Erik, "Using FPGAs to Implement Self-Timed Systems", Journal of VLSI Signal Processing, 6, 173-190 (1993)

Teifel and Manohar, "An Asynchronous Dataflow FPGA Architecture", IEEE Transactions on Computers, Vol. 53, No. 11, November 2004

Sutherland and Ebergen, Computers without clocks, Scientific American August 2002

A Muller C Element is described in D. E. Muller and W. S. Bartky, "A theory of asynchronous circuits," Proceedings of an International Symposium on the Theory of Switching, Cambridge, April 1957, Part I., ser. Annals of the Computation Laboratory of Harvard University Cambridge, Mass.: Harvard University, vol. XXIX, pp. 204-243, 1959

An asynchronous execution model can be implemented as a self timed processor as defined in System Timing, by Charles L. Seitz, Chapter 7, Introduction to VLSI Systems, C. Mead, L. Conway.

Manually controlling placement in field programmable gate arrays is described in *Seventh Annual IEEE Symposium on Field-Programmable Custom Computing Machines* p. 284 VHDL Placement Directives for Parametric IP Blocks by James Hwang, Xilinx; Cameron Patterson, Xilinx; and Sujoy Mitra, Xilinx.

Non-synchronous hardware emulator, U.S. Pat. No. 6,832,185 Musselman, et al.

Multiprocessor for hardware emulation, U.S. Pat. No. 5,551,013 Beausoleil, et al.

Partial crossbar interconnect architecture for reconfigurably connecting multiple reprogrammable logic devices in a logic emulation system, U.S. Pat. No. 5,448,496 Butts, et al.

BACKGROUND OF THE INVENTION

In conventional circuit emulators and hardware assisted logic simulators, the techniques of timing analysis and clock distribution are carefully applied to ensure correct results. Catastrophic errors occur if the clocking system of the design tool results in setup and hold violations. The objective of improved design debug time is replaced by debugging and tuning the tools rather than the design. In the worst case, all the complexity of designing and fabricating a supercomputer comes into the critical path of verifying a chip.

To ensure accuracy of the model, the hardware accelerator may have to be operated far below its intended capacity and throughput. Worse yet, delay faults in the actual design may be masked by delay faults in the hardware emulator or simulator. Because of the physical hierarchy of a hardware accelerator or emulator (chips, boards, chassis) necessary to contain the amount of logic that can be fabricated onto a single chip, there are many more bottlenecks in the design tools to be addressed.

The present invention builds upon a previously disclosed architecture for hardware acceleration of a simulation of a electronic circuit described in a hardware description language at the register transfer level of abstraction. The description of the circuit is compiled to instructions adapted to be executed on customized evaluation processors which are embodied in application specific integrated circuits or FPGAs.

Thus it can be appreciated that what is needed is a method of compiling a desired design into files suitable for programming a hardware accelerator that increases performance, eliminates vulnerabilities to delay faults, and has scalable capacity.

SUMMARY OF THE INVENTION

The Hammer Architecture consists of a number of Units linked by Message Processors. Each Unit consists of a Sequencing Processor and a number of CLOE and Octal evaluators that are fully connected. The Sequencing Processor orchestrates the execution of a number of domains of a logic circuit; when a domain spans more than one unit the message processors send non blocking messages and receive blocking messages; the receipt of blocking messages orchestrates multi-unit execution.

Rather than attempting to implement a fully synchronous architecture across chips, boards, backplanes, and multiple chassis, the present invention allows mixing of asynchronous and synchronous elements at the hierarchy borders.

For example, a board populated by chips operating in an asynchronous mode may provide a synchronous communication and control over the chips. Or a board may provide asynchronous handshaking among a plurality of chips which individually are self-synchronous but not in lock-step with a chip adjoining it.

Of course a plurality of levels of hierarchy may be asynchronously operated using the method of the present invention. The invention discloses a method of compiling asynchronous completion handshaking means into a desired design without requiring the designer to himself insert a emulation figment into the desired design files.

An embodiment of the present invention comprises a Sequencing Processor, Message Processor, and Levelized Asynchronous Domain Evaluation processor in a Field Programmable Gate Array (FPGA) whereby a different embodiment of the Hammer Architecture is possible. This embodiment achieves higher performance, robustness being less vulnerable to delay faults, and lower cost of development.

DETAILED DESCRIPTION

Figure 1:
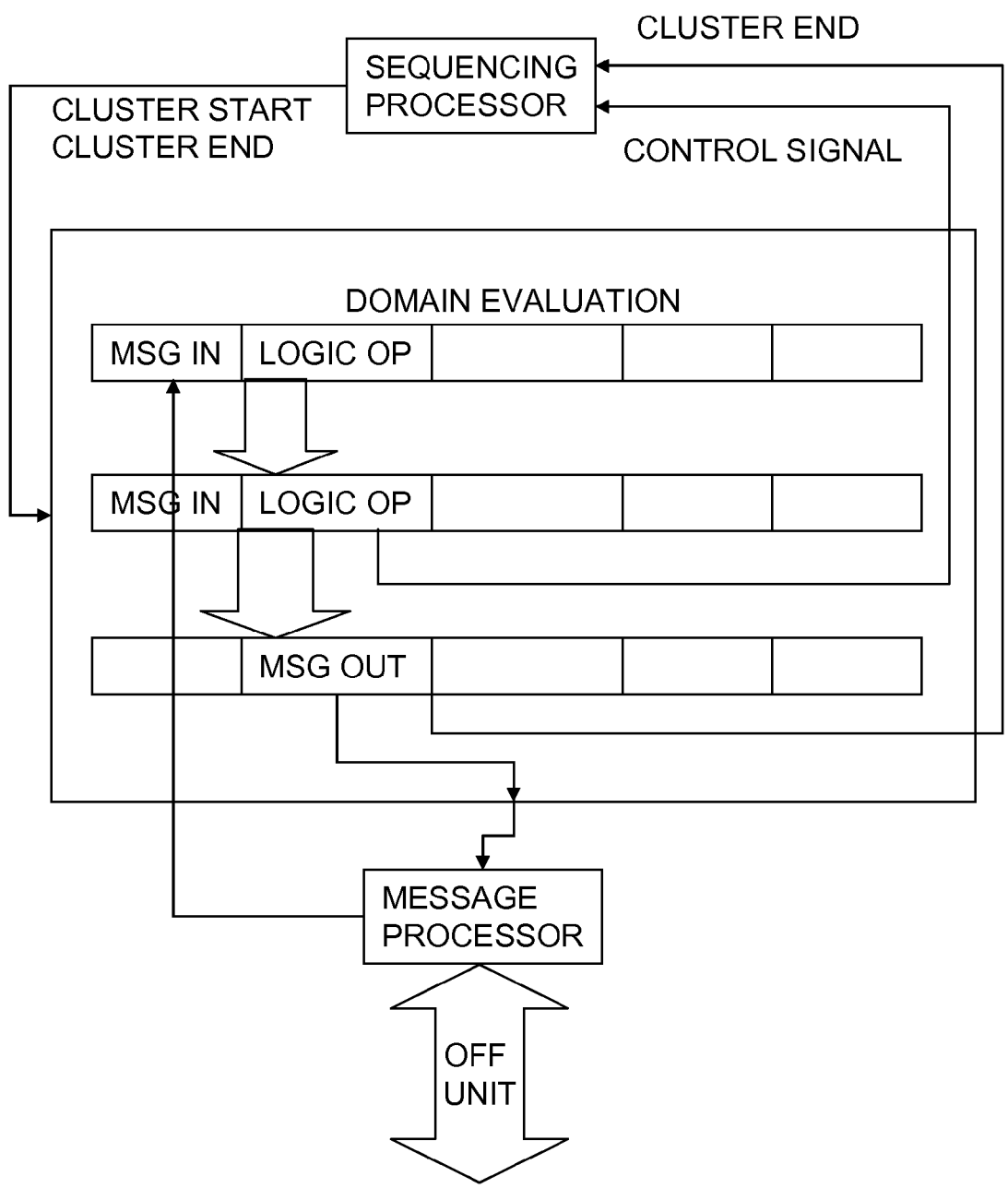
FIG. 1 is a control flow diagram.

Referring now to the drawings, FIG. 1 shows a control flow wherein a sequence processor initiates a plurality of domain evaluations by signaling a cluster start control and query for cluster end control. During the domain evaluation, logic data is passed from one evaluation processor to its successor evaluation processors within the same unit. A message processor uses blocking signals to transfer data to evaluation processors on other units.

A hardware accelerated simulator or emulator with the capacity for a modern chip will necessarily have multiple levels of physical hierarchy. Consider a board A on which is mounted a plurality of chips B. The same principles apply to multiple boards in a backplane of a chassis or even larger scaling. Conventional emulators and simulation accelerators have a complex clock distribution network which balance delays so that all the elements of hierarchy level B operate simultaneously. Careful timing analysis is needed and physical routing of clock traces to avoid setup and hold violations. Both A and B would be considered synchronous. Four other possibilities should be considered. Both A and B could operate asynchronously or only A, only B, and a mix. The present invention addresses a method of compiling a desired design to any of these four approaches. B units do not have to be uniformly one or the other. A system may be compiled having at least one of subsystem B characterized as an asynchronous completion handshaking circuit and at least one of subsystem B characterized as a synchronous circuit ie. heterogeneous B units.

A compiler according to the present invention reads a hardware description language specification of a desired design and locates state domains which are the clocks of the system that are coherent. The compiler further finds the logic that is incidental to the clocks and any logic that is shared by domains. The logic which is shared could be duplicated or more efficiently, evaluated as a predecessor to the domains it is embedded in.

Figure 2:
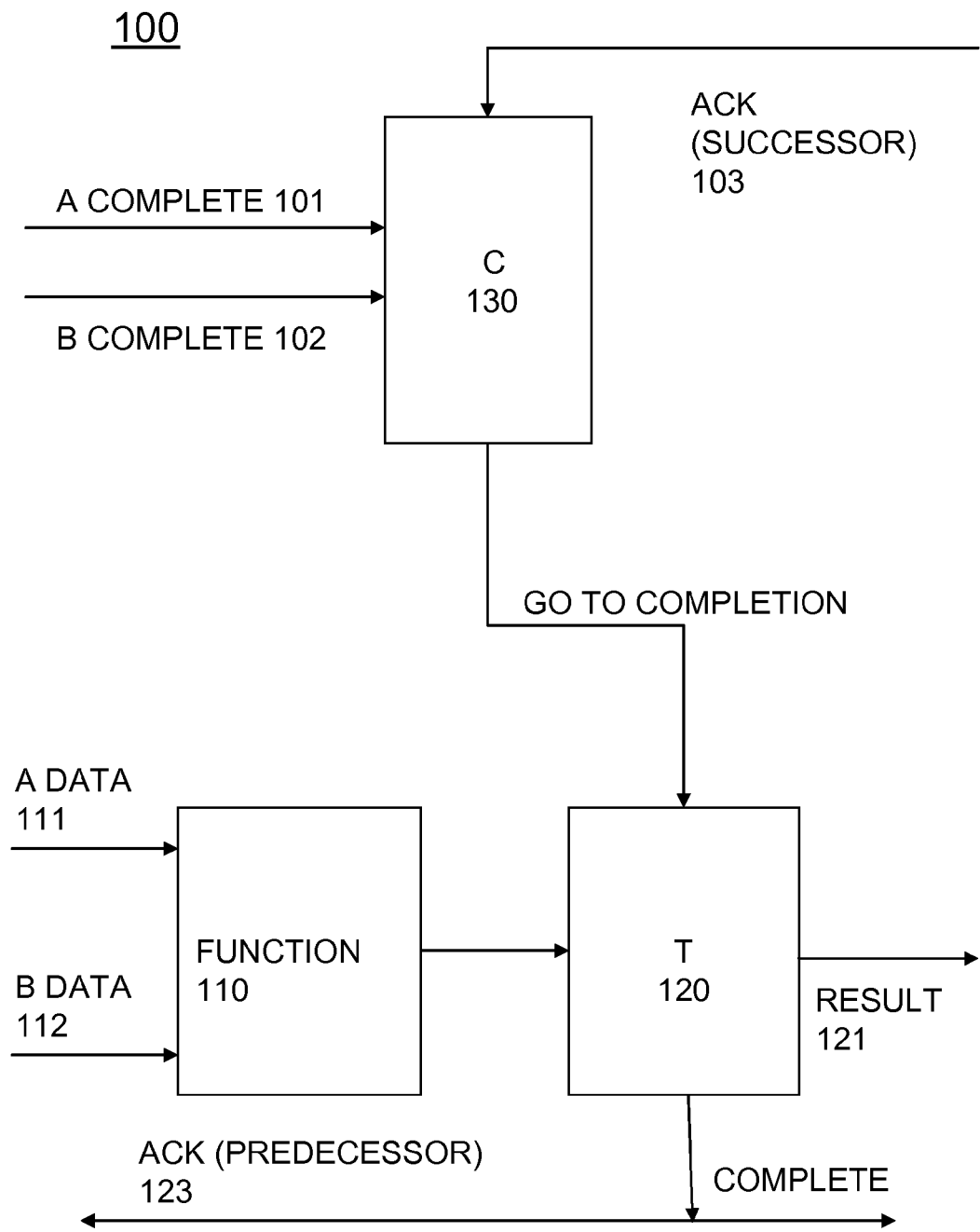
FIG. 2 is schematic of one Levelized Asynchronous Domain Evaluation Processor.

Referring now to FIG. 2, a single levelized asynchronous domain evaluation processor LADE 100 comprises a rendezvous circuit 130, in an embodiment a C element, electrically coupled to a T circuit, in an embodiment a transition latch. The rendezvous circuit receives a plurality of signal complete signals from predecessor LADE processors (101, 102 . . . ), and at least one ACK 103 from a successor LADE PROCESSOR which triggers a T circuit 120 to hold and transmit the values resulting from a plurality of data inputs (111, 112, . . . ) electrically coupled through a logic function 110 such as an instruction evaluator. The T circuit further signals completion and ACK 123 to both predecessors and successors. Sutherland discloses a C element enabled in a schematic which detects completion of a predecessor and emits an edge triggering a latch as a T circuit as part of a hand crafted asynchronous pipeline in his paper referenced above.

In the present invention certain asynchronous completion handshake logic is embedded into the emulation/simulation model of the design by the compiler without the modification of the design files by the designer. This logic provides that logic can be evaluated as soon as and not until its inputs are stable. This prevents both delay faults and accelerates the evaluation. Means for asynchronous completion handshake is disclosed below.

In one embodiment the chips may operate synchronously within themselves but the transfer of data between chips may be done by asynchronous handshake so any chip may start as soon as its data are complete. Or board level clocks can be controlled by waiting until asynchronous complete is received from all chips.

The present invention is a system comprising a hardware description language compiler program product and an apparatus for emulating the behavior of a chip fabricated according to the hardware description language, the apparatus comprising an electronic system A further comprising a plurality of signal paths and control circuits and further comprising a plurality of electronic subsystems B coupled to the signal paths and the control circuits.

One embodiment of the invention is an architecture where electronic subsystem B is characterized as a synchronous circuit and the remainder of electronic system A exclusive of B is characterized as an asynchronous completion handshaking circuit. Another embodiment of the invention is an architecture where electronic subsystem B is characterized as an asynchronous completion handshaking circuit and the remainder of electronic system A exclusive of B is characterized as a synchronous circuit. A third embodiment of the invention is an architecture where both electronic subsystem B is characterized as an asynchronous completion handshaking circuit and the remainder of electronic system A exclusive of B is characterized as an asynchronous completion handshaking circuit. A fourth embodiment mixes synchronous and asynchronous B units.

In all cases an asynchronous completion handshaking circuit comprises a rendezvous circuit described elsewhere in the referenced literature. An embodiment of the LADE processor comprises a rendezvous circuit, at least two inputs x and y and at least two outputs z and kzero wherein output z provides a result of a boolean logic operation on inputs x and y and output kzero provides signaling that the boolean logic operation has been completed.

Figure 3:
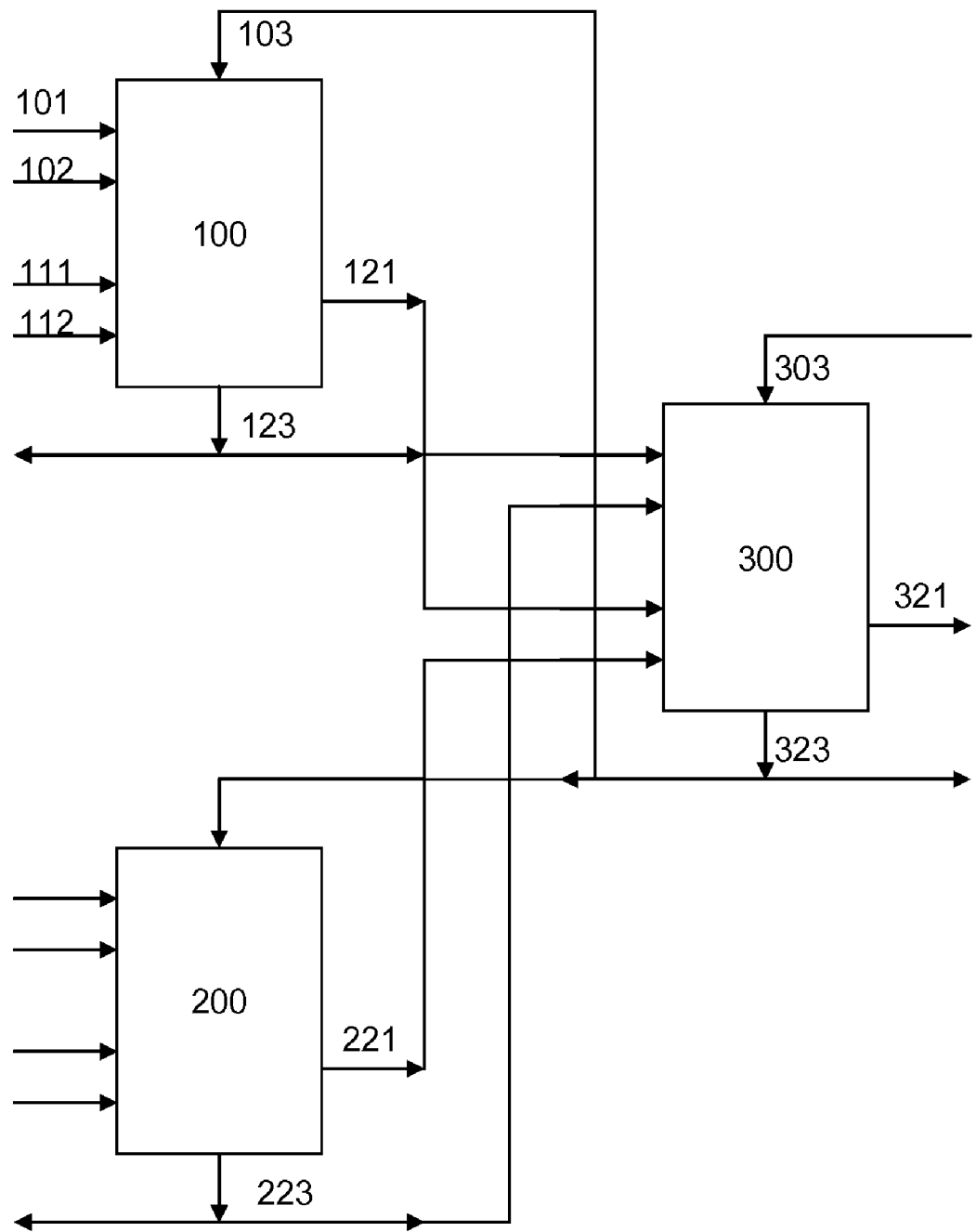
FIG. 3 is a schematic showing the interconnection among three Levelized Asynchronous Domain evaluation Processors.

Referring now to FIG. 3, domain evaluation can be cascaded by having an asynchronous completion handshaking circuit which further comprises at least one input kminusone whereby kzero is on output signalling completion only if the circuit receives a similar signal on input kminusone. Three LADE processors (100, 200, 300) are interconnected as an embodiment of the present invention. LADE processor 300 is the successor to both 100 and 200. Thus signal completion on 123 and 223 are necessary before LADE 300 will evaluate its function on data provided by 121 and 221. LADE 100 processor will only emit its result 121 and completion 123 when LADE processor 300 signals ready to receive 323 and when its input data 111 and 112 are complete 101 and 102. It is particularly emphasized that no clocks are shown and that the data will propagate as fast as the data is available rather than on a clock edge.

The invention comprises a method for compiling a hardware description language, tangibly embodied on computer readable media as instructions adapted to control a processor, comprising the steps of: finding a state domain within a circuit specified in a hardware description language; tracing combinational logic operations which are incidental to the state domain; identifying combinational logic operations which are shared by a plurality of state domains, and generating a plurality of binary files adapted to program an FPGA to perform combinational logic operations. State domain and clock domain are interchangeable concepts.

The compiler inserts means for asynchronous completion handshaking into a plurality of binary files adapted to program an FPGA to perform combinational logic operations wherein the means for asynchronous completion handshaking is not specified in a hardware description language.

The compiler inserts means for transferring a signal between an FPGA and a second FPGA using a message processor and message processor instruction.

The compiler has the steps of levelizing domains and inserting domain evaluation control means between levels whereby a domain is not evaluated until a predecessor domain asynchronously signals completion.

The present invention is a method for compiling a hardware description language to a plurality of units comprising the step of compiling means for asynchronous completion handshaking between units whereby each unit receives an input asynchronous completion signal when its input data values are ready and initiates its internal clocking system independently of other unit clocks.

The present invention is a method for compiling a hardware description language to a plurality of units comprising the steps of compiling means for asynchronous completion signaling into each unit and triggering a central clock generation and distribution network when all units have signaled completion.

In general, the invention is a method for compiling a hardware description language to a plurality of files adapted to program an FPGA comprising the step of inserting a rendezvous element into the FPGA programming file wherein a rendezvous circuit indicates when the last of a plurality of signals arrives whereby a synchronous design is modeled by an asynchronous circuit that is driven by availability of valid data not clocks.

An Embodiment

The Levelized Asynchronous Domain Evaluation (LADE) processor is an embodiment of the CLOE/Octal evaluation processor. FIG. 1 presents the System View of this implementation approach, and provide details on a method of building the Levelized Asynchronous Domain Evaluation processor. The Sequencing Processor generates Cluster Start/End enables to execute a Domain. Domain execution is controlled by a control sequence program that uses control signal values generated by the user design and external events (in case of cosimulation) to determine the domain to be executed.

The Message Processor sends messages generated by Domain Evaluation to other Units. Messages sent by other Units are turned into message ready signals and message data for Domain Evaluation.

The Domain Evaluation is done by the LADE processor; this processor has levels of instructions to execute. A sequence of levels of instruction is called a Domain. Each level of instruction consists of many sub-instructions. Each level of instruction can be executed only after the predecessor level of instruction is complete. In the case of a level with "msg in" it can execute only after the predecessor level is complete and the "msg in" message has been received. The first level in a domain can be executed when the Sequencing Processor enables the level with a Cluster Start message. Cluster End will result in a message back to the Sequencing Processor.

The execution model of the LADE processor is asynchronous; it starts execution of a level when a predecessor level sends a level complete message; each level sends a message to the successor level when it completes; Cluster Start is a message from the Sequencing Processor to the LADE processor. Cluster End is a request message from Sequencing Processor to LADE Processor; the Cluster End request is acknowledged with the Completion message of the Cluster End level.

Levelized Asynchronous Domain Evaluation (LADE) Processor

The LADE Processor can be implemented in at least one of the following methods:

1. Each sub-instruction is a asynchronous data driven processor that accepts input operands and input value completion messages and generates result values and result completion messages.
2. Each level of sub-instructions is a asynchronous data driven processor that accepts input operands and one or more predecessor level completion messages and generates result values and level completion messages.
3. Each level of instructions can be bundled into a few sets of sub-instruction bundles; each sub-instruction bundle is implemented in at least one asynchronous data driven processor.

Asynchronous Processor for a Sub-Instruction

An example of a rendezvous circuit is the Muller C Element. In general a rendezvous circuit identifies when the last of a plurality of signals arrive at a certain stage.

In an embodiment, a Muller C Element produces a output message signal only when all its inputs have produced message signals. By connecting the completion message of the input operands to a Muller C Element the time at which the predecessors of a sub-instruction are ready is detected. The operation logic of a sub-instruction is connected to a transition latch; the transition latch is enabled by the Muller C Element to capture the value produced by the sub-instruction. In this operation the asynchronous processor produces a result only after all its input operands have produced a completion message. After the result is captured the transition latch produces a completion message output for a successor stage. After the result is captured the transition latch produces a acknowledge signal which produces a acknowledge message output for its preceding stages.

By connecting the acknowledge of each successor stage to the predecessor stage Muller C Element, the predecessor stage holds back data production until the successor stage is ready. For correct operation the Muller C Element, the Instruction and Transition Latch have to have the low delay on the wires connecting them. In cases where a "msg in" operation is involved the predecessor completion signal will come from the Message Processor. In an embodiment, correct operation can be ensured for FPGA implementation by providing the placement directives to the FPGA place and route tool.

Bundling Sub-Instructions or Whole Levels

By bundling a set of sub-instructions together a single Complete/Ready message is generated for the bundle. In an embodiment, a successor bundle contains a Muller C Element that detects completion of at least one predecessor bundle and not individual Operands. This provides capacity savings since fewer Muller C Elements are required.

When bundling a set of sub-instructions the FPGA implementation ensures that sub-instructions are grouped together on the FPGA to ensure low delay on the wires ensure correct operation through placement directives.

Signal Trace

Trace data is captured in this architecture by the insertion of capture point elements at the required visibility points. Capture point elements are chained to form one or more capture threads. Data from the capture threads is consolidated in a thread consolidation unit which compresses the data and writes it at high speed to DRAM attached directly to the target FPGA. The overheads (space and time) associated with trace are varied by changing the length and number of trace threads used as well as the frequency with which they capture signal data. Capture frequency is thread specific and can be varied across time and space (threads).

The invention includes a method for compiling an apparatus for levelized asynchronous data driven domain evaluation comprising the steps of adapting the placement directives of a field programmable gate array to have low delay on the wires connecting a transition latch, an instruction evaluator, and a transition latch control, translating a hardware description of a circuit to at least one instruction evaluator, and compiling a transition latch control, a transition latch, and an instruction evaluator to a programming file for a field programmable gate array.

The transition latch control in an embodiment comprises one of a shift register and a Muller C element. The transition latch comprises one of a D-Flipflop, a scan flop, a register, a look up table, a CLB, a RAM, a memory block, and a parallel latch.

Translating a hardware description comprises generating a set of sub-instructions, bundling a set of sub-instructions, grouping sub-instructions together on the field programmable gate array to ensure low gate delay on their interconnected wires, enabling each bundle of sub-instructions to execute only after the predecessor bundles have completed, wherein enabling comprises inserting a Muller C Element that detects completion of predecessor bundles wherein a bundle comprises at least one operand.

An embodiment of the invention is a system comprising a software program product compiler, a plurality of units, and a field programmable gate array place and route software tool. Each unit is a sequencing processor, at least one evaluation processor, and at least one message processor whereby units communicate via the message processor by sending non-blocking messages and receiving blocking messages and wherein the evaluation processor is a levelized asynchronous domain evaluation processor.

A levelized asynchronous domain evaluation processor is at least one asynchronous evaluation processor comprising a bundle of at least one sub-instruction evaluation processor, wherein a sub-instruction evaluation processor generates result values and level completion messages and accepts input operands and at least one predecessor level completion message. The sub-instruction asynchronous evaluation processor is an asynchronous processor comprising a transition latch that holds result values, and generates level completion messages, a transition latch control that receives at least one predecessor level completion messages, successor level acknowledgement messages, input operands and triggers the transition latch, and an instruction evaluator that receives instruction operands and generates result values.

An embodiment of a latch enable comprises a Muller C Element. The signal trace capture points elements at the required visibility points and a capture thread comprising the chained capture point elements coupled to high speed DRAM attached directly to the target field programmable gate array whereby the overhead and capture frequency is thread specific and can be varied by changing the length and number of threads during compilation of the design.

An evaluation processor has at least one circuit value storage element, attached to a Muller C element, attached to at least one instruction evaluator, wherein the output of the instruction evaluator is electrically coupled to the input of the circuit value storage element and wherein the output of the Muller C element is controllably coupled to the control input of the circuit value storage element. An output of the transition latch is coupled to a predecessor LADE processor and coupled to a successor LADE processor whereby the receipt of data is acknowledged to the predecessor LADE processor and availability of data is annunciated to the successor LADE processor thereby releasing the Muller C elements of the predecessor and successor LADE processors to control the next cycle of the circuit value storage elements.

Conclusion

The present invention is a continuation in part of an apparatus for accelerated hardware simulation of a circuit described in a hardware description language. The innovative processors are embodied within a Field Programmable Gate Array. The present invention is a method for compiling a hardware description to a plurality of asynchronously executing data driven processors within an FPGA comprising the steps of adapting the placement directives of a field programmable gate array to have low delay on the wires connecting a transition latch, an instruction evaluator, and a transition latch control, translating a hardware description of a circuit to at least one instruction evaluator, and compiling a transition latch control, a transition latch, and an instruction evaluator to a programming file for a field programmable gate array. The compiler has in its partitioning resource the ability to split the design among synchronous and asynchronous subunits.

The transition latch control can be a Muller C element. The transition latch can be a D-Flipflop, a scan flop, a register, a look up table, a CLB, a RAM, a memory block, or a parallel latch. The instruction evaluation processors are a subject of another patent application and are not described here.

In conventional hardware simulators and emulators either an external clock is provided to control execution of processors or an internal clock generation circuit uses a delay logic to determine a period and a clock distribution network routes a clock among elements of a processor or a plurality of time-multiplexed logic evaluators. In the event of early or late arrival of data or clock, erroneous values are propagated. In the present invention this bottleneck and source of error is eliminated by using the data itself as the control of predecessor and successor LADE processors.

Although particular embodiments of the present invention have been shown and described, it will be obvious to those skilled in the art that changes and modifications may be made without departing from the present invention in its broader aspects, and therefore, the appended claims are to encompass within their scope all such changes and modifications that fall within the true scope of the present invention.

What is claimed is:

1. A method for compiling a hardware description language circuit description, tangibly embodied on computer readable media as instructions adapted to control a processor, comprising the steps of:
   finding a state domain within a circuit specified in a hardware description language description;
   tracing combinational logic operations which are incidental to the state domain;
   identifying combinational logic operations which are shared by a plurality of state domains;
   generating a plurality of binary files adapted to program an FPGA to perform combinational logic operations;
   and compiling means for asynchronous completion handshaking into a plurality of binary files adapted to program an FPGA to perform combinational logic operations wherein the means for asynchronous completion handshaking is not specified in said hardware description language circuit description.

2. The method of claim 1 further comprising
   compiling means for transferring a signal between an FPGA and a second FPGA using a message processor sending non-blocking messages and receiving blocking messages.

3. The method of claim 1 further comprising the steps of:
   levelizing domains; and
   inserting domain evaluation control means between levels whereby a domain is not evaluated until a predecessor domain asynchronously signals completion.

4. A method for generating a programming file to configure an apparatus for levelized asynchronous data driven domain evaluation comprising the steps of:
   translating a hardware description language specification of a circuit to one instruction evaluator, a transition latch that holds result values, and generates level completion messages, and a transition latch control, said instruction evaluator coupled to said transition latch, and said transition latch coupled to said transition latch control;

adapting a plurality of placement directives of a field programmable gate array compiler to configure low delay on the wires connecting said transition latch, said instruction evaluator, and said transition latch control;

compiling said transition latch control, said transition latch, and said instruction evaluator to a programming file for a field programmable gate array;

wherein the transition latch control is one of a shift register and a Muller C element, and the transition latch is one of a D-Flipflop, a scan flop, a register, a look up table, a CLB, a RAM, a memory block, and a parallel latch; and wherein translating a hardware description language specification of a circuit comprises:

generating a set of sub-instructions, bundling a plurality of sets of sub-instructions as predecessor bundles and successor bundles, grouping sub-instructions together on the field programmable gate array to ensure low gate delay on their interconnected wires, and automatically inserting a Muller C Element not in the hardware description language specification of a circuit which enables each bundle of successor sub-instructions to execute only after its respective predecessor bundles have completed.

5. A unit apparatus comprising a sequencing processor, coupled to at least one evaluation processor, and each evaluation processor coupled to at least one message processor whereby units communicate via the message processor by sending non-blocking messages and receiving blocking messages and wherein each evaluation processor is a levelized asynchronous domain evaluation processor comprising a transition latch and a transition latch control.

6. The levelized asynchronous domain evaluation processor of claim 5 comprising a bundle of at least one sub-instruction asynchronous evaluation processor, to generate result values and level completion messages and to accept input operands and at least one predecessor level completion message, wherein each sub-instruction asynchronous evaluation processor comprises a transition latch that holds result values, and generates level completion messages, controllably coupled to and triggered by a transition latch control that receives at least one predecessor level completion message, and/or a successor level acknowledgement message, and triggers the transition latch, and said transition latch further coupled to an instruction evaluator that receives instruction operands and generates the result values.

7. An evaluation processor apparatus comprising:

one circuit value storage element, said circuit value storage element attached to a Muller C element, and said circuit value storage element further attached to one levelized asynchronous instruction evaluator comprising a transition latch and a transition latch control, wherein an output of the levelized asynchronous instruction evaluator is electrically coupled to an input of the circuit value storage element and wherein an output of the Muller C element is controllably coupled to a control input of the circuit value storage element, whereby the Muller C element controls the circuit value storage element to store a result computed by the levelized asynchronous instruction evaluator when the Muller C element determines that completion messages have been received from all inputs of the asynchronous instruction evaluator.

8. The evaluation processor apparatus of claim 7 wherein said at least one circuit value storage element further comprises a completion message output coupled to a predecessor evaluation processor and to a successor evaluation processor whereby receipt of data is acknowledged to the predecessor evaluation processor and availability of data is annunciated to the successor evaluation processor.

* * * * *